United States Patent [19]

Shimizu et al.

[11] Patent Number: 5,241,205
[45] Date of Patent: Aug. 31, 1993

[54] SEMICONDUCTOR MEMORY DEVICE

[75] Inventors: Shin Shimizu, Kawasaki; Katsuji Iguchi, Yamatokoriyama; Seizo Kakimoto, Shiki; Tsukasa Doi, Kitakatsuragi, all of Japan

[73] Assignee: Sharp Kabushiki Kaisha, Osaka, Japan

[21] Appl. No.: 953,197

[22] Filed: Sep. 29, 1992

Related U.S. Application Data

[63] Continuation of Ser. No. 718,412, Jun. 24, 1991, abandoned.

[30] Foreign Application Priority Data

Jun. 26, 1990 [JP] Japan ................... 2-168798

[51] Int. Cl.$^5$ .................. H01L 29/68; H01L 27/02; H01L 27/10; H01L 23/48
[52] U.S. Cl. ........................ 257/368; 257/401; 257/296; 257/390; 257/499
[58] Field of Search ............. 357/23.6, 41, 45, 68; 257/368, 401, 296, 390, 499

[56] References Cited

U.S. PATENT DOCUMENTS

| | | | |
|---|---|---|---|
| 4,462,090 | 6/1984 | Iizuka | 365/185 |
| 5,134,588 | 7/1992 | Kubota et al. | 365/207 |

FOREIGN PATENT DOCUMENTS

| | | |
|---|---|---|
| 0045578 | 2/1982 | European Pat. Off. |
| 0051158 | 5/1982 | European Pat. Off. |
| 0223616 | 5/1987 | European Pat. Off. |
| 0337436 | 10/1989 | European Pat. Off. |

OTHER PUBLICATIONS

S. Kimura et al, A New Stacked Capacitor DRAM Cell Characterized by a Storage Capacitor on a Bit-line Structure, IEDM 88, pp. 596-599.
K. Torii et al, Three Dimensional Effects on Submicrometer Diagonal MOSFETs, Extended Abstracts of the 21st Conference on Solid State Devices and Materials, Tokyo, 1989, pp. 101-104.
T. Ema et al, 3-Dimensional Stacked Capacitor Cell For 16M and 64M Drams, IEDM 88, pp. 592-595.

*Primary Examiner*—Mark V. Prenty
*Attorney, Agent, or Firm*—Nixon & Vanderhye

[57] ABSTRACT

A semiconductor memory device is provided which includes a plurality of memory cells, each of which includes: an active region having an MOS transistor formed in the surface portion of a semiconductor substrate; a gate electrode formed on the substrate for the MOS transistor so as to divide the active region into a source-side active region with a storage contact and a drain-side active region with a bit contact, the portion of the active region which is positioned under the gate electrode functioning as a channel region for the MOS transistor; a first impurity-implanted region formed in a portion of the source-side active region so as to overlap with part of the storage contact and the gate electrode, the portion of the source-side active region which overlaps with the first impurity-implanted region functioning as a source region for the MOS transistor; and a second impurity-implanted region formed in a portion of the drain-side active region so as to overlap with at least one part of the bit contact and the gate electrode, the portion of the drain-side active region which overlaps with the second impurity-implanted region functioning as a drain region for the MOS transistor.

7 Claims, 9 Drawing Sheets

FIG. 9
PRIOR ART
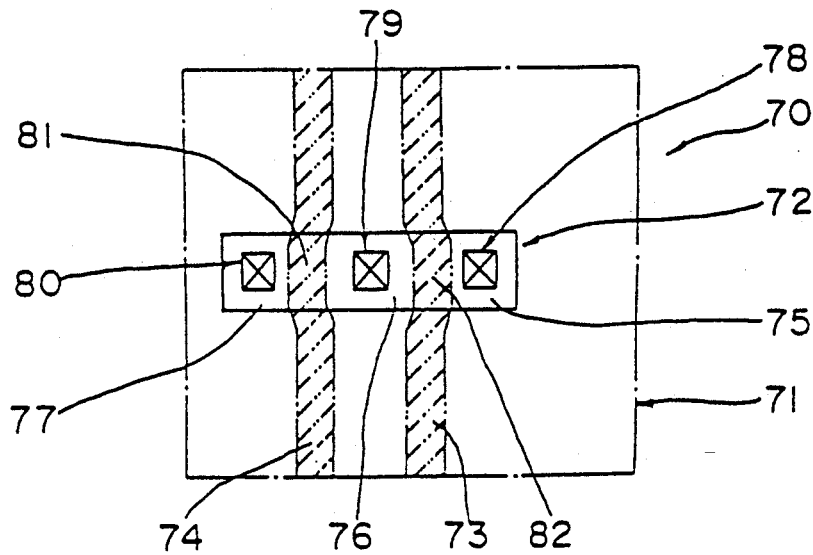
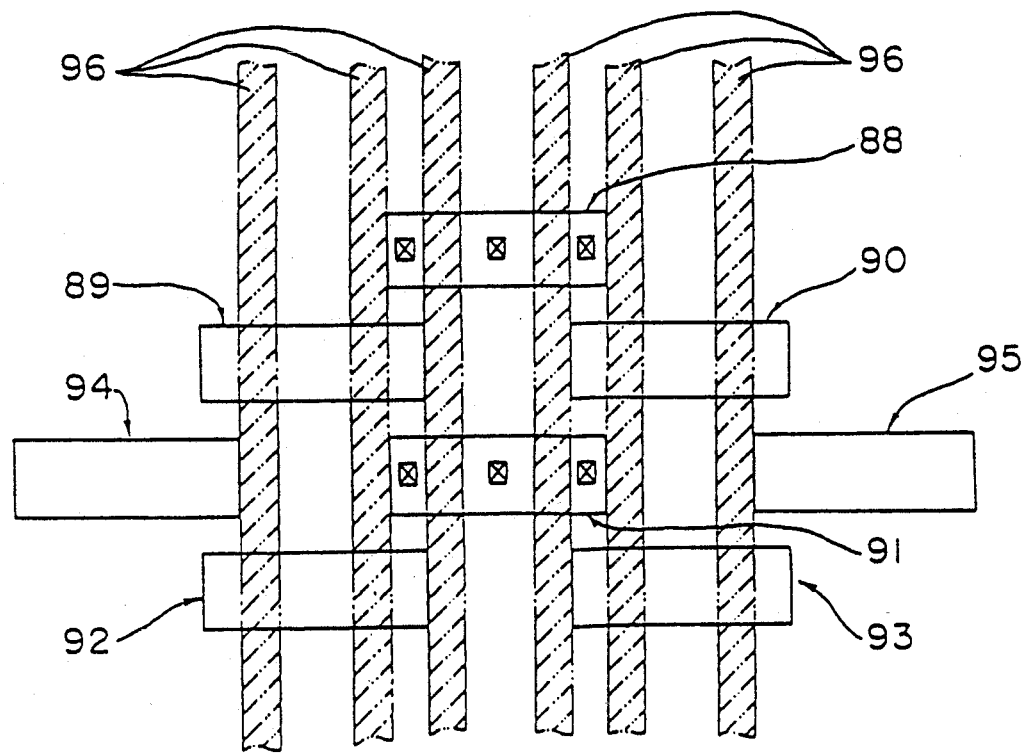
FIG. 10
PRIOR ART

SEMICONDUCTOR MEMORY DEVICE

This is a continuation of application Ser. No. 07/718,412, filed Jun. 24, 1991, now abandoned.

RELATED APPLICATION

This application is related to commonly assigned prior application Ser. No. 07/558,328 filed Jul. 27, 1990 and now U.S. Pat. No. 5,134,588 entitled "Semiconductor Memory Device" and naming Messrs. Kubota and Iguchi as inventors.

BACKGROUND OF THE INVENTION

1. Field of the Invention

This invention relates to a highly integrated and large-capacity semiconductor memory device which includes MOS (metal-oxide-semiconductor) transistors.

2. Description of the Prior Art

FIG. 9 shows a memory cell portion of a conventional semiconductor memory device including MOS transistors. The memory device has a semiconductor substrate 70 on which a rectangular active region 72 is formed by an LOCOS isolation method (local oxidation method) or by a trench isolation method. Gate electrodes 73 and 74 are formed from polysilicon in such a manner as to intersect the active region 72. Portions of the active region 72 positioned under the gate electrodes 73 and 74 function as channel regions 82 and 81, respectively. A drain region 76 is formed in a portion of the active region 72 interposed between the gate electrodes 73 and 74. In the other portions of the active region 72 are formed source regions 75 and 77, which are positioned adjacent to the gate electrodes 73 and 74, respectively.

The gate electrode 73, channel region 82, source region 75 and drain region 76 constitute an MOS transistor, while the gate electrode 74, channel region 81, source region 77 and drain region 76 constitute another MOS transistor. The two MOS transistors have the drain region 76 in common.

The drain region 76 is connected to a bit line (not shown) through a bit contact 79. The source regions 75 and 77 are connected to one of the electrodes of a charge storage capacitor (not shown) through storage contacts 78 and 80, respectively.

The above-described two MOS transistors, bit contact 79, storage contacts 78 and 80, and charge storage capacitor constitute a memory cell of the semiconductor memory device. The gate electrodes 73 and 74 function as word lines through which address signals are fed into the memory cell.

In cases where a memory cell such as described above has n-type MOS transistors, the application of a high potential bias to the gate electrode 73 or 74 allows one of the two MOS transistors to be in the on state. At this time, if the memory cell is in the read state, a signal charge stored in the capacitor is transmitted into the drain region 76 through the storage contact 78 or 80, source region 75 or 77 and channel region 82 or 81 of the MOS transistor in the on state. The signal charge is then sent to a sense amplifier (not shown) through the bit contact 79 and the bit line. Conversely, if the memory cell is in the write state, a signal charge is transmitted from the drain region 76 in the reverse direction through the above-mentioned components into the capacitor, where the signal charge is stored.

In the production of MOS transistors of such a memory cell, impurity ions are implanted into an active region to form source and drain regions while providing ohmic contacts between the resulting regions and the electrode material. The impurity ions are usually implanted into, for example, the entire area (impurity-implanted region 71 as shown in FIG. 9) of the MOS transistors. The gate electrodes 73 and 74 function as a mask for the ion implantation, so that the impurity ions can be implanted into the areas corresponding to the source and drain regions to be formed. In this case, a portion of the active region on the drain side becomes the drain region 76, and portions of the active region on the source sides become the source regions 75 and 77.

Most of conventional DRAMs (dynamic random access memories) which are known as semiconductor memory devices have folded bit lines in order to attain high resistance to noise. Thus, when the active regions are rectangular as shown in FIG. 9, the respective memory cells are arranged as shown in FIG. 10. As shown in the figure, active regions 89, 90, 92 and 93 are disposed close to the active region 91. The active regions are arranged in columns parallel to gate electrodes 96 functioning as word lines. The active regions in one column are shifted from those in the columns adjacent thereto by half the pitch of the active regions in each row. For example, as shown in the figure, the active regions 88 and 91 are respectively shifted from the active regions 89 and 92, and also from the active regions 90 and 93, by half the pitch, i.e., by half of the distance between the active regions 88 and 91.

For the formation of an isolation region which electrically isolates one active region from another, a silicon substrate is locally oxidized using the LOCOS isolation method in the production of 4-megabit DRAMs (4M DRAMs) or other memory devices with a relatively low integration level. On the other hand, in the production of 16M DRAMs and 64M DRAMs which are highly integrated memory devices with minute structures, it is necessary to form a narrow isolation region with a width of 0.6 to 0.7 μm and with a width of 0.4 to 0.5 μm, respectively. However, an isolation region with a width of 0.4 to 0.7 μm cannot be formed by the use of the LOCOS isolation method. Thus, for the production of highly integrated memory devices which require a narrow isolation region, the trench isolation method should be used to form the isolation region.

A conventional semiconductor memory device such as described above has the following problems:

1) As shown in FIG. 9, the impurity-implanted region 71 overlaps with the entire surface of the MOS transistors. Thus, during the subsequent heat treatment in the formation of the minute structure of memory cells, the impurity ions previously implanted into the impurity-implanted region 71 will be diffused by heat from the source regions 77 and 75 and the drain region 76 into the channel regions 81 and 82, through the entire boundaries between the channel region 81 and the source region 77 and drain region 76 and also through the entire boundaries between the channel region 82 and the source region 75 and drain region 76. This causes a noticeable short channel effect such as a reduced threshold voltage and a reduced punch through breakdown voltage, thereby increasing leakage current, particularly in an MOS transistor which is the smallest transistor unit used for the memory cell of DRAMs. As a result, it becomes difficult for the capacitor to store signal charges in the storage operation of the memory cells.

2) Since the impurity-implanted region 71 overlaps with the entire surface of the MOS transistors as described above, the total area of the source regions 75 and 77 and drain region 76 becomes relatively large. Thus, the junction capacitance which arises between the silicon substrate 70 and the source and drain regions 77, 75 and 76 increases. In particular, the parasitic capacitance of the bit lines increases, thereby increasing the power consumption and reducing the operation speed.

3) As shown in FIG. 10, in memory devices having folded bit lines, the distances between the active region 91 and the active regions 89, 90, 92 and 93 are half or less of that between the active region 91 and the active region 88. Accordingly, the isolation region to be formed is uneven in width between the respective active regions. It is, however, extremely difficult to form an isolation region with an uneven width by the trench isolation method. Thus, the production of highly-integrated 16M DRAMs or 64M DRAMs requires two isolation methods; i.e., the LOCOS isolation method which enables the formation of an isolation region with an uneven width, and the trench isolation method which enables the formation of a narrow isolation region with a width of 0.4 to 0.7 $\mu$m. The use of the two methods causes a complicated production process.

SUMMARY OF THE INVENTION

The semiconductor memory device of this invention, which overcomes the above-discussed and numerous other disadvantages and deficiencies of the prior art, comprises a plurality of memory cells, each of which comprises: an active region having an MOS transistor formed in the surface portion of a semiconductor substrate; a gate electrode formed on the substrate for the MOS transistor so as to divide the active region into a source-side active region with a storage contact and a drain-side active region with a bit contact, the portion of the active region which is positioned under the gate electrode functioning as a channel region for the MOS transistor; a first impurity-implanted region formed in a portion of the source-side active region so as to overlap with part of the storage contact and the gate electrode, the portion of the source-side active region which overlaps with the first impurity-implanted region functioning as a source region for the MOS transistor; and a second impurity-implanted region formed in a portion of the drain-side active region so as to overlap with at least one part of the bit contact and the gate electrode, the portion of the drain-side active region which overlaps with the second impurity-implanted region functioning as a drain region for the MOS transistor.

In a preferred embodiment, the active regions in the memory cells are disposed in columns parallel to the gate electrode, and the active regions in two adjacent columns are alternately arranged so that all the distances between the adjacent active regions are approximately equal to each other.

In a preferred embodiment, the active region is T-shaped.

In another preferred embodiment, the active region is Y-shaped.

In still another preferred embodiment, the active region is V-shaped.

In a further preferred embodiment, the active region is set diagonally across the gate electrode.

Thus, the invention described herein makes possible the objectives of (1) providing a semiconductor memory device which has a significantly reduced short channel effect to assure high reliability in the storage operation; (2) providing a semiconductor memory device which has a significantly reduced junction capacitance to provide high-speed operation with less power consumption; and (3) providing a semiconductor memory device having an isolation region which can readily be formed by a simple process.

BRIEF DESCRIPTION OF THE DRAWINGS

This invention may be better understood and its numerous objects and advantages will become apparent to those skilled in the art by reference to the accompanying drawings as follows:

FIG. 9 is an enlarged view showing a memory cell portion of a conventional semiconductor memory device.

FIG. 10 is a plan view of the conventional semiconductor memory device of FIG. 9.

DESCRIPTION OF THE PREFERRED EMBODIMENTS

Figure 1:
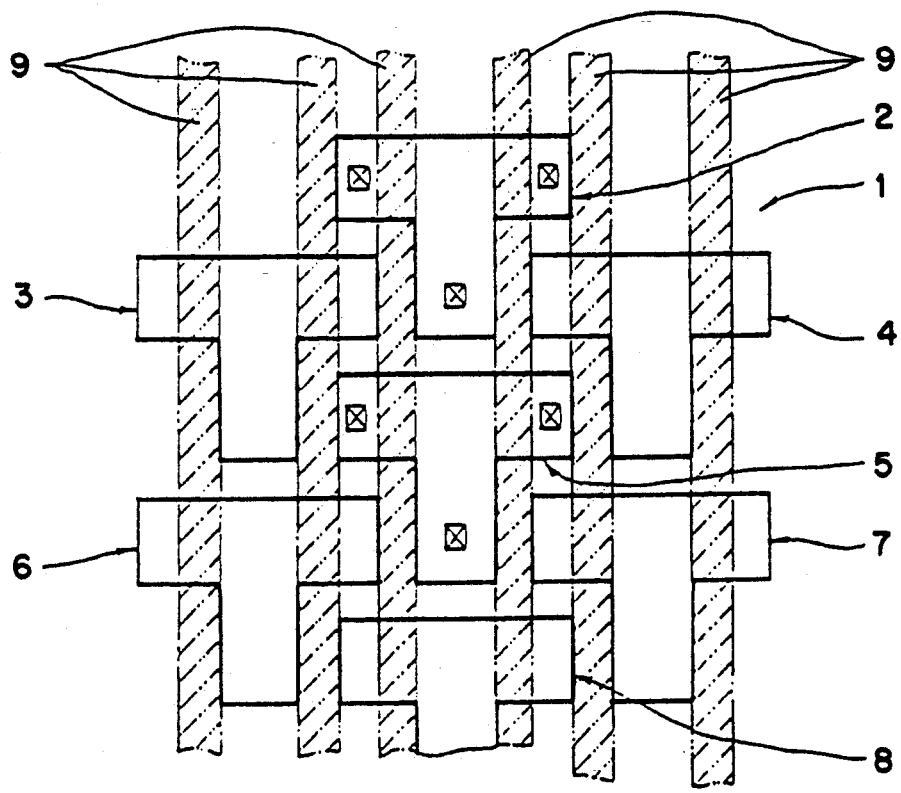
FIG. 1 is a plan view showing a semiconductor memory device of this invention.

The semiconductor memory device of this invention has a plurality of T-shaped or Y-shaped active regions including MOS transistors on a semiconductor substrate. The T-shaped or Y-shaped active regions are arranged in columns in such a manner that the active regions in two adjacent columns are shifted from each other to allow all the distances between adjacent active regions to be substantially equal. The formation of the isolation region does not require the LOCOS isolation method which enables the formation of an isolation region with an uneven width, but requires only the trench isolation method which enables the formation of a narrow isolation region. Thus, in the production of the memory device of the present invention, the isolation region can readily be formed by a simple process.

In the semiconductor memory device of this invention, an impurity-implanted region for the formation of a source region overlaps with only part of the active region on the source side and also overlaps with part of a contact area of the source-side active region. Similarly, an impurity-implanted region for the formation of a drain region overlaps with only part of the active region on the drain side and also overlaps with part of a contact area of the drain-side active region.

When impurity ions are implanted into the above-described impurity-implanted regions, a portion of the source-side active region overlapping with the impurity-implanted region becomes a source region, while a portion of the drain-side active region overlapping with the impurity-implanted region becomes a drain region. Thus, in the heat treatment to be performed after the ion implantation, the injected impurity ions are diffused from the source and drain regions into a channel region through only a portion of each boundary between the channel region and the source-side and drain-side active regions. This prevents the effective channel length from becoming shorter, thereby significantly reducing the short channel effect.

Furthermore, the total area of the source and drain regions can be significantly reduced, as compared with a conventional semiconductor memory device having an impurity-implanted region which overlaps with the entire area of the memory cell. The reduction in the area of the source and drain regions decreases the junction capacitance between the semiconductor substrate and the source and drain regions. Therefore, the parasitic capacitance of the semiconductor memory device can be reduced, which assures high reliability in the storage operation of the memory device.

According to the present invention, active regions may be in other forms, e.g., they may be V-shaped or may be set diagonally across gate electrodes. In these cases, the impurity-implanted regions for the formation of source and drain regions overlap with only part of the source-side and drain-side active regions, so that the above-described advantages such as a reduced short channel effect and a reduced junction capacitance can also be attained.

The invention will be further described by reference to the following examples.

EXAMPLE 1

FIG. 1 shows a semiconductor memory device according to this invention. The semiconductor memory device of this example includes a semiconductor substrate 1 with T-shaped active regions 2, 3, 4, 5, 6, 7 and 8 formed in the surface portion thereof. Gate electrodes 9 are formed on the semiconductor substrate 1. The active regions 2 to 8 are arranged in a manner based on the folded bit line system. The downward extending portion of each of the T-shaped active regions 2 to 8 is interposed between the two adjacent gate electrodes 9.

The active regions 2 to 8 are arranged in rows parallel to the gate electrodes 9. The active regions in two adjacent columns are alternately arranged, e.g., the active regions 2, 5 and 8 alternate with the active regions 3 and 6, and also with the active regions 4 and 7, so that all the distances between the two adjacent active regions are approximately equal. Thus, an isolation region which electrically isolates one active region from another can be formed with a uniform width. This eliminates the necessity of using the LOCOS isolation method which enables the formation of isolation regions with an uneven width. Therefore, even in the production of a highly integrated semiconductor memory device which requires a narrow isolation region, it is not necessary to use a complicated process which includes both the LOCOS isolation method and the trench isolation method for the formation of the isolation region. The isolation region can be formed using only the trench isolation method which is useful in the formation of a narrow isolation region. In the production of the semiconductor memory device of this example, the isolation region can readily be formed by a simple process, as compared with cases where all the distances between adjacent active regions are not equal.

Figure 2:
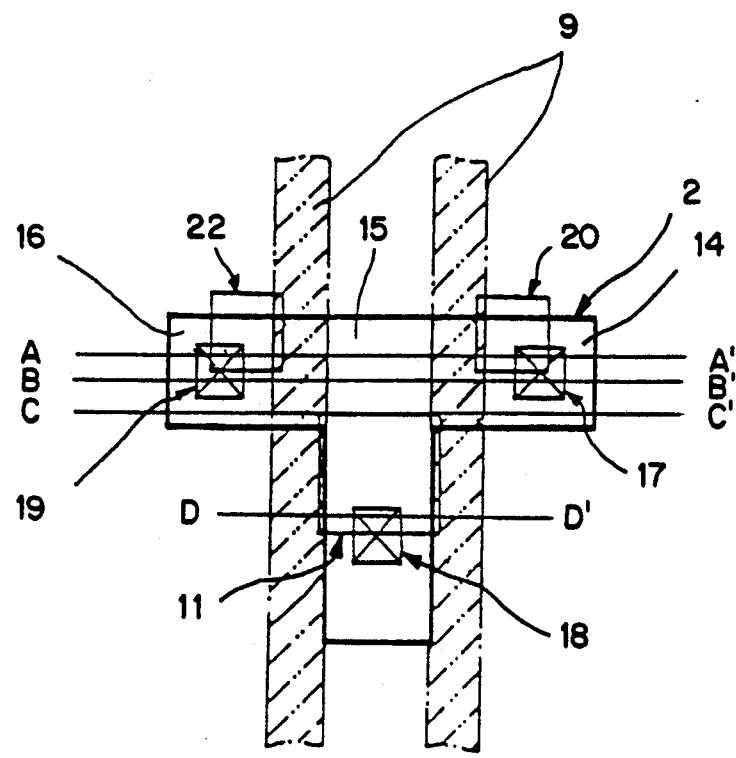
FIG. 2 is an enlarged view showing an active region of the semiconductor memory device of FIG. 1.

FIG. 2 is an enlarged view showing the active region 2 of FIG. 1. The active region 2 and the two gate electrodes 9 which intersect the active region 2 constitute a pair of MOS transistors. Portions of the active region 2 which are positioned under the gate electrodes 9 function as channel regions. The active region 2 has regions 14 and 16 on the source side (i.e., source-side active regions 14 and 16) and also has a region 15 on the drain side (i.e., drain-side active region 15). Storage contacts 17 and 19 which function as contact areas are disposed on the source-side active regions 14 and 16, respectively. A bit contact 18 which also functions as a contact area is disposed on the drain-side active region 15.

The MOS transistors are also provided with impurity-implanted regions 20 and 22 for the source-side active regions 14 and 16, respectively, and with an impurity-implanted region 11 for the drain-side active region 15. The impurity-implanted region 20 overlaps with part of the source-side active region 14 and part of the storage contact 17. The impurity-implanted region 22 overlaps with part of the source-side active region 16 and part of the storage contact 19. The impurity-implanted region 11 overlaps with part of the drain-side active region 15 and part of the bit contact 18. Impurity ions are implanted into these impurity-implanted regions 20, 22 and 11 to form source and drain regions. Portions of the source-side active regions 14 and 16 which respectively overlap with the impurity-implanted regions 20 and 22 become source regions. Similarly, a portion of the drain-side active region 15 which overlaps with the impurity-implanted region 11 becomes a drain region.

Figure 3A:
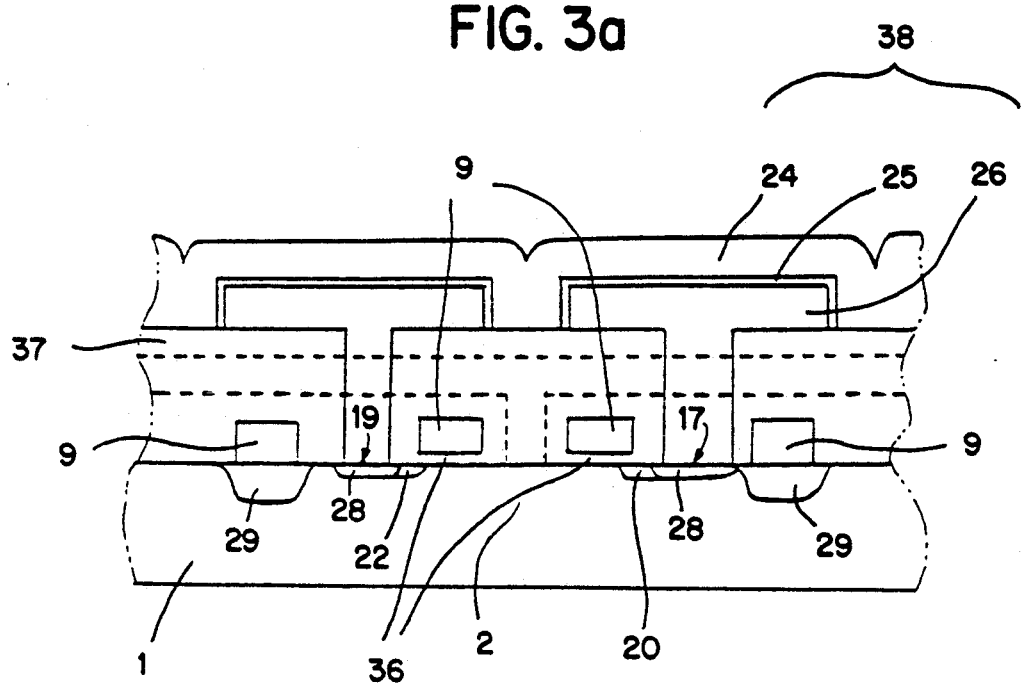
FIGS. 3a to 3d are sectional views of the semiconductor memory device taken along lines A-A', B-B', C-C' and D-D' of FIG. 2, respectively.

FIG. 3a is a sectional view of the semiconductor memory device taken along line A-A' of FIG. 2. In FIG. 3a, two other gate electrodes 9 are also shown which are respectively adjacent to the gate electrodes 9 of FIG. 2. The gate electrodes 9 shown in FIG. 2 are formed above the active region 2 with gate insulators 36 interposed therebetween. The other gate electrodes 9 are formed on the isolation region 29. Interlayer insulators 37 are formed on all the gate electrodes 9 and on the substrate 1, while some portions of the active region 2 remain uncovered.

The semiconductor memory device further includes capacitors 38 each having an upper plate electrode 24 and a lower plate electrode 26 with a capacitor dielectric film 25 interposed therebetween. The upper plate electrode 24 is common to all the capacitors 38. The lower plate electrodes 26 are formed on the interlayer insulators 37 and also on the portions of the active region 2 which are not covered with the interlayer insulators 37. The interfaces between the active region 2 and the lower plate electrodes 26 function as the storage contacts 17 and 19. The impurity-implanted regions 20 and 22 for the formation of the source regions are located in the surface portion of the substrate 1. As shown in this figure, the storage contacts 17 and 19 are provided on part of the impurity-implanted region 20 and part of the impurity-implanted region 22, respectively. In the impurity-implanted regions 20 and 22, n-type diffusion regions 28 are formed by impurity diffusion from the storage contacts 17 and 19, respectively.

The n-type diffusion region 28 may be spaced apart from the isolation region 29, as shown in FIG. 3a. On the other hand, the storage contact 17 shown in this figure is wider than each gate electrode 9, in which case the n-type diffusion region 28 on the right in this figure is in contact with the isolation region 29.

Figure 3B:
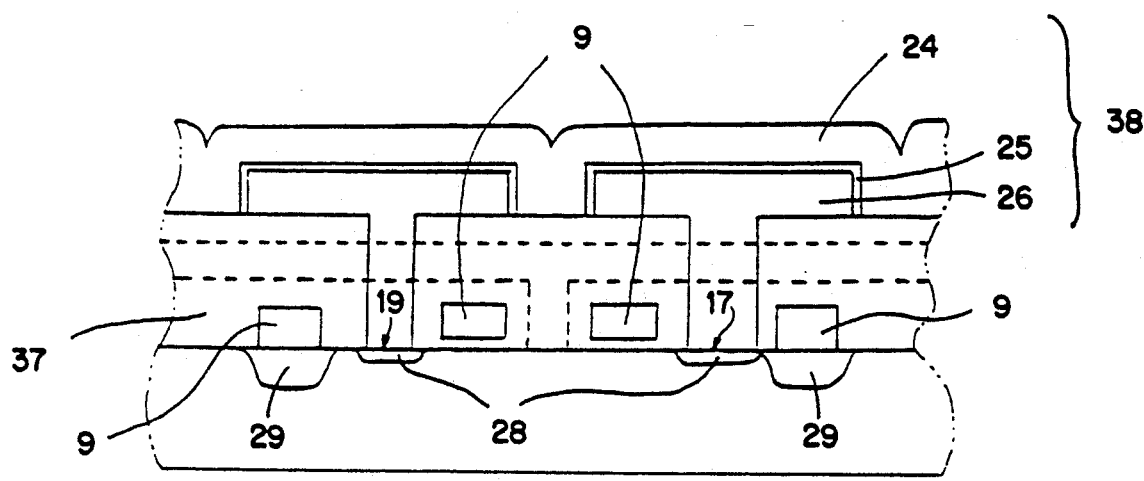
Figure 3C:
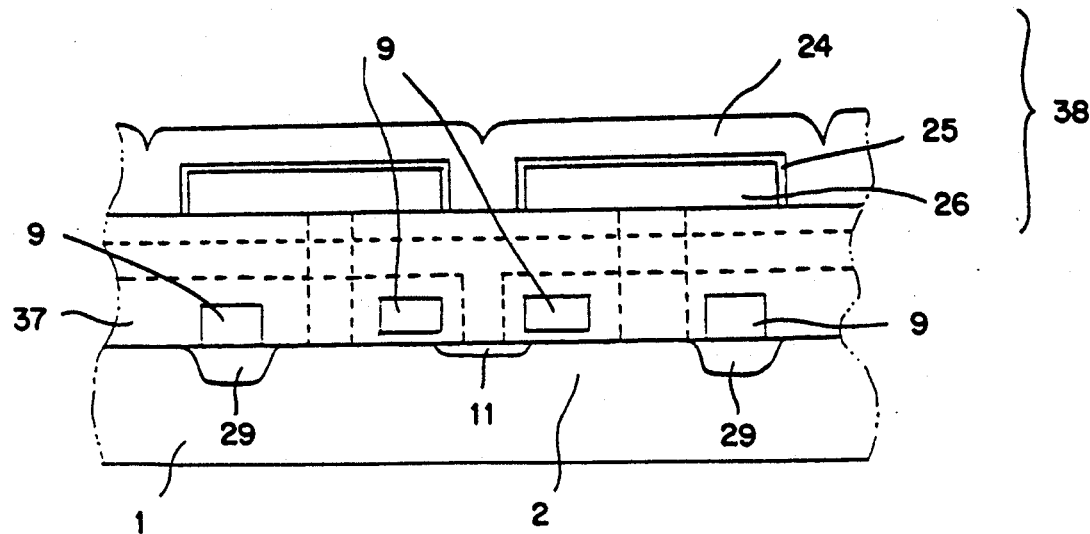
Figure 3D:
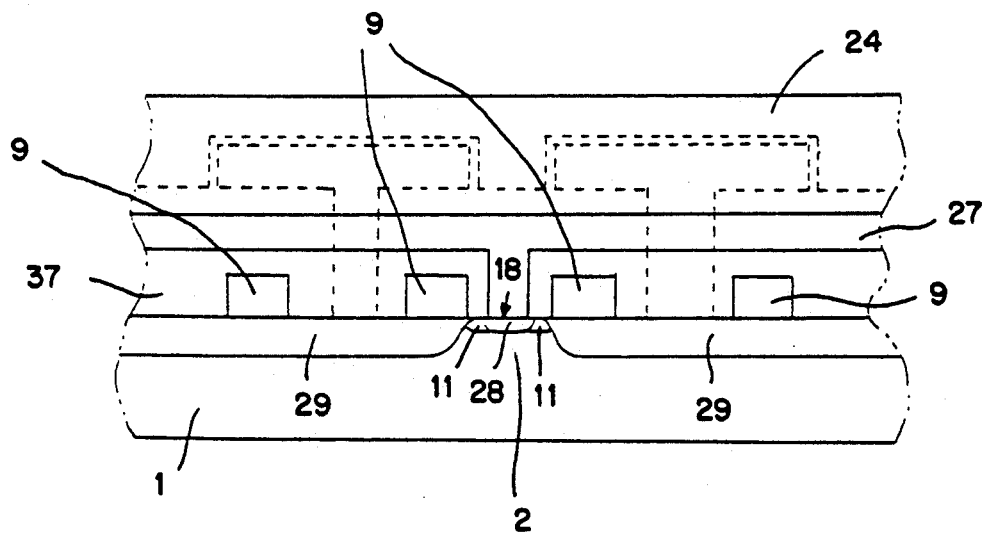

FIGS. 3b, 3c and 3d are sectional views of the semiconductor memory device taken along lines B–B', C–C' and D–D' of FIG. 2, respectively. No impurity-implanted region 20, 22 or 11 can be seen in FIG. 3b. The impurity-implanted region 11 for the formation of the drain region is shown in FIGS. 3c and 3d. As shown in the figures, the impurity-implanted region 11 is located in the surface portion of the substrate 1.

In FIG. 3d, all the gate electrodes 9 are located on the isolation region 29. A portion of the active region 2 which is not covered with the interlayer insulators 37 is in contact with a bit line 27. The interface between the bit line 27 and the active region 2 functions as the bit contact 18. In the impurity-implanted region 11, an n-type diffusion region 28 is also formed by impurity diffusion from the bit contact 18.

Since each impurity-implanted region 20 or 22 only overlaps with part of the corresponding source-side active region 14 or 16, the resultant source region occupies only part of the corresponding source-side active region 14 or 16. Also, the boundary between the source region and the channel region adjacent thereto occupies only a portion of the entire boundary between the corresponding source-side active region 14 or 16 and the channel region adjacent thereto. Similarly, the drain region occupies only part of the drain-side active region 15, and the boundary between the drain region and each channel region adjacent thereto also occupies only a portion of the entire boundary between the drain-side active region 15 and each channel region adjacent thereto.

In the memory device of this example shown in FIGS. 1, 2 and 3a to 3d, each MOS transistor has an independent impurity-implanted region 20 or 22 for the corresponding source-side active region 14 or 16. According to the present invention, however, two adjacent source-side active regions belonging to different MOS transistors may have a single impurity-implanted region in common. Alternatively, such two adjacent source-side active regions and a drain-side active region positioned therebetween may have a single impurity-implanted region in common.

EXAMPLE 2

Figure 4:
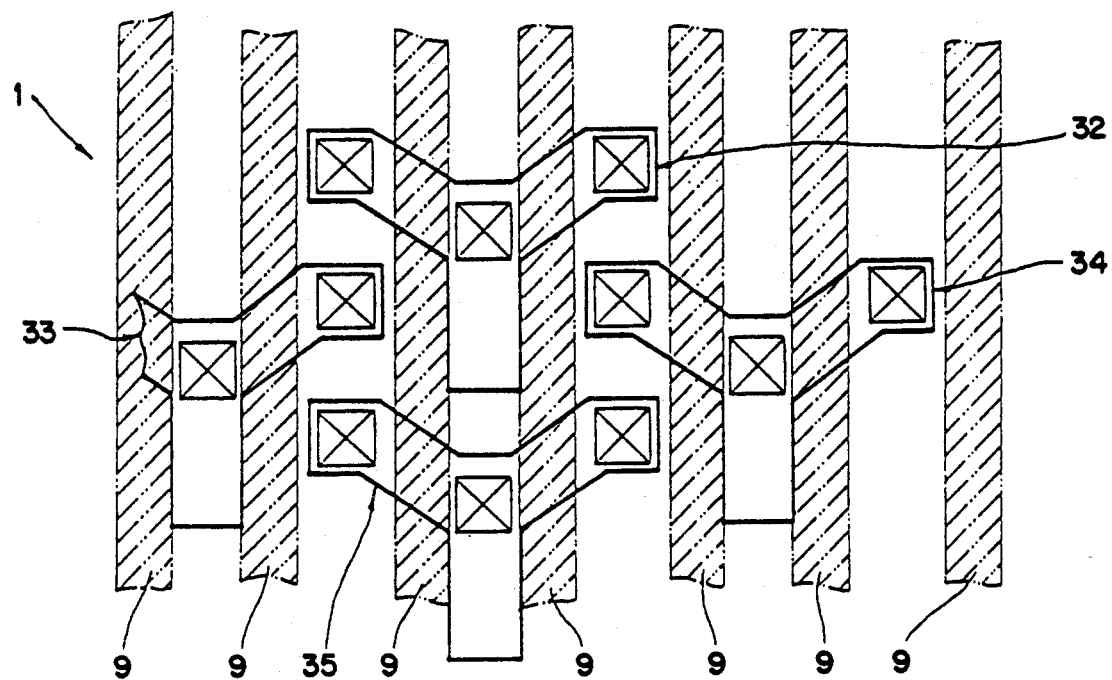
FIG. 4 is a plan view showing another semiconductor memory device of this invention.

FIG. 4 shows another semiconductor memory device according to the invention. The memory device of this example is produced in substantially the same manner as the device of FIGS. 1, 2 and 3a to 3d, except that the active regions are Y-shaped instead of being T-shaped. Thus, the same reference numerals represent the same components in FIGS. 1 through 4.

As shown in FIG. 4, the semiconductor memory device includes the semiconductor substrate 1 with Y-shaped active regions 32, 33, 34 and 35 formed in the surface portion thereof. Gate electrodes 9 are formed on the semiconductor substrate 1. The active regions 32 to 35 are arranged in a manner based on the folded bit line system. The downward extending portion of each of the Y-shaped active regions 32 to 35 is interposed between the two adjacent gate electrodes 9.

In the same manner as in the memory device of FIG. 1, the active regions 32 to 35 are arranged in columns parallel to the gate electrodes 9. The active regions in two adjacent columns are alternately arranged, so that all the distances between the two adjacent active regions are approximately equal. For example, the active regions in the column including the active regions 32 and 35 alternate with those in the column including the active region 33 and also with those in the column including the active region 34. Thus, also in this example, since the isolation region to be formed has a uniform width, it is not necessary to use the combination of the LOCOS isolation method and the trench isolation method for the formation of the isolation region. The isolation region can be formed only by the use of the trench isolation method which is useful in the formation of a narrow isolation region.

In the memory device of this example, each MOS transistor may have its own impurity-implanted region in the same manner as in the memory device shown in FIG. 2. Alternatively, adjacent MOS transistors may have an impurity-implanted region in common in the same manner as in the memory device shown in FIG. 7 which will be described later.

EXAMPLE 3

Figure 5:
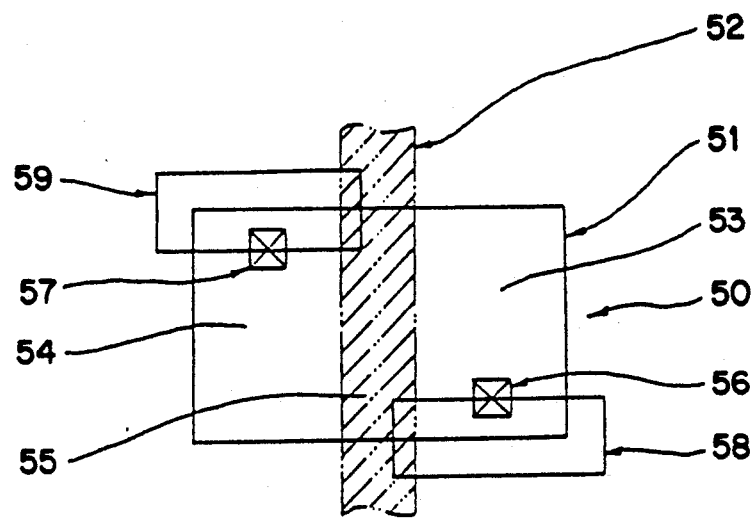
FIG. 5 is a plan view showing an active region of still another semiconductor memory device according to this invention.

FIG. 5 shows still another semiconductor memory device according to the invention. The memory device of this example has a semiconductor substrate 50 with an active region 51 formed in the surface portion thereof. A gate electrode 52 is formed on the semiconductor substrate 50. The active region 51 includes a source-side active region 53 and a drain-side active region 54 which are provided with contact areas 56 and 57, respectively. The contact areas 56 and 57 are shifted in position from each other along a direction parallel to the gate electrode 52. The portion of the active region 51 positioned under the gate electrode 55 functions as a channel region. The gate electrode 52 and the active region 51 constitute an MOS transistor.

The memory device of this example is also provided with impurity-implanted regions 58 and 59 into which impurity ions are implanted to form source and drain regions. The impurity-implanted region 58 overlaps with part of the source-side active region 53 and part of the contact area 56, and the impurity-implanted region 59 overlaps with part of the drain-side active region 54 and part of the contact area 57. Thus, the resultant source region occupies only part of the source-side active region 53. The boundary between the source region and the channel region occupies only a portion of the boundary between the source-side active region 53 and the channel region. Similarly, the drain region occupies only part of the drain-side active region 54, and the boundary between the drain region and the channel region occupies only a portion of the boundary between the drain-side active region 54 and the channel region.

Figure 6:
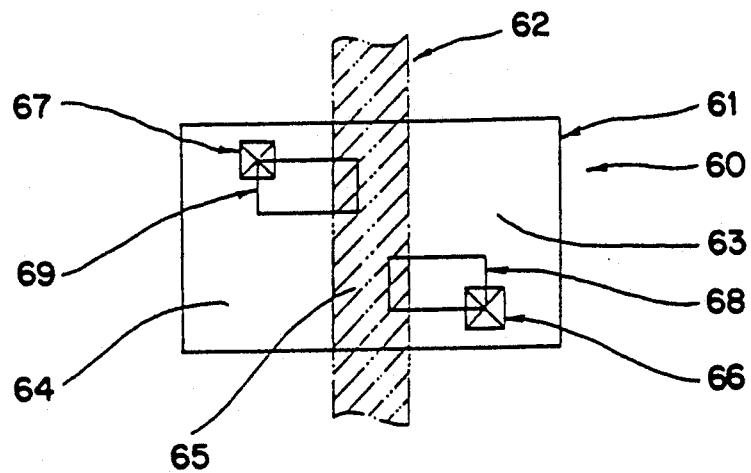
FIG. 6 is a plan view showing an active region of a modified version of the semiconductor memory device of FIG. 5.

In the memory device of FIG. 5, both the impurity-implanted regions 58 and 59 are partly located outside the active region 51. According to the present invention, however, the impurity-implanted regions may be entirely located inside the active region in the same manner as in a semiconductor memory device shown in FIG. 6 which is a modified version of the memory device of FIG. 5. In FIG. 6, the impurity-implanted regions are denoted by the reference numerals 68 and 69. Except for the location of the impurity regions, the memory device of FIG. 6 is produced in the same manner as that of FIG. 5.

EXAMPLE 4

Figure 7:
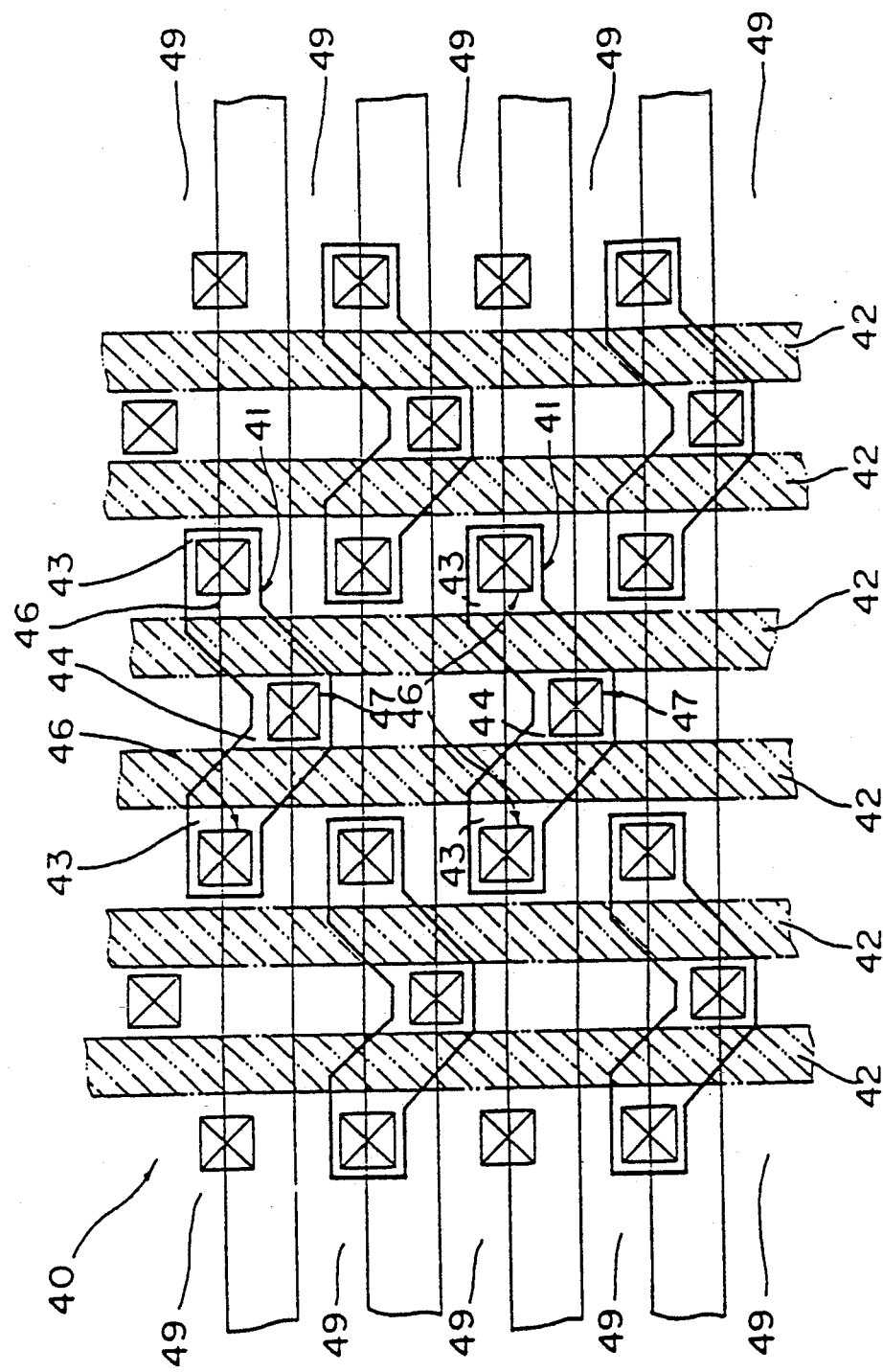
FIG. 7 is a plan view showing another modified version of the semiconductor memory device of FIG. 5.

FIG. 7 shows still another modified version of the semiconductor memory device of FIG. 5. This memory device includes a semiconductor substrate 40 with V-shaped active regions 41 formed in the surface portion thereof. Gate electrodes 42 are formed on the semiconductor substrate 40. Each of the active regions 41 includes two source-side active regions 43 and a drain-side active region 44. Each source-side active region 43 and each drain-side active region 44 have contact areas 46 and 47, respectively. The portions of each active region 41 positioned under the gate electrodes 42 function as channel regions. Each active region 41 and the two gate electrodes 42 intersecting the active region 41 constitute two MOS transistors.

Impurity-implanted regions 49 overlap with part of each source-side active region 43, part of each contact area 46, part of each drain-side active region 44, and part of each contact area 47. Impurity ions are implanted into the impurity-implanted regions 49 to form source and drain regions. The source regions are formed in the portions of the source-side active regions 43 overlapping with the impurity-implanted regions 49, and the drain regions are formed in the portions of the drain-side active regions 44 overlapping with the impurity-implanted regions 49.

Since the impurity-implanted regions 49 overlap with only part of each source-side active region 43, each of the resultant source regions occupies only part of the corresponding source-side active region 43. Also, the boundary between the source region and the channel region adjacent thereto occupies only a portion of the boundary between the source-side active region 43 and the channel region. Similarly, each of the drain regions occupies only part of the corresponding drain-side active region 44, and the boundary between the drain region and each channel region adjacent thereto also occupies only a portion of the entire boundary between the drain-side active region 44 and each channel region 40 adjacent thereto.

EXAMPLE 5

Figure 8:
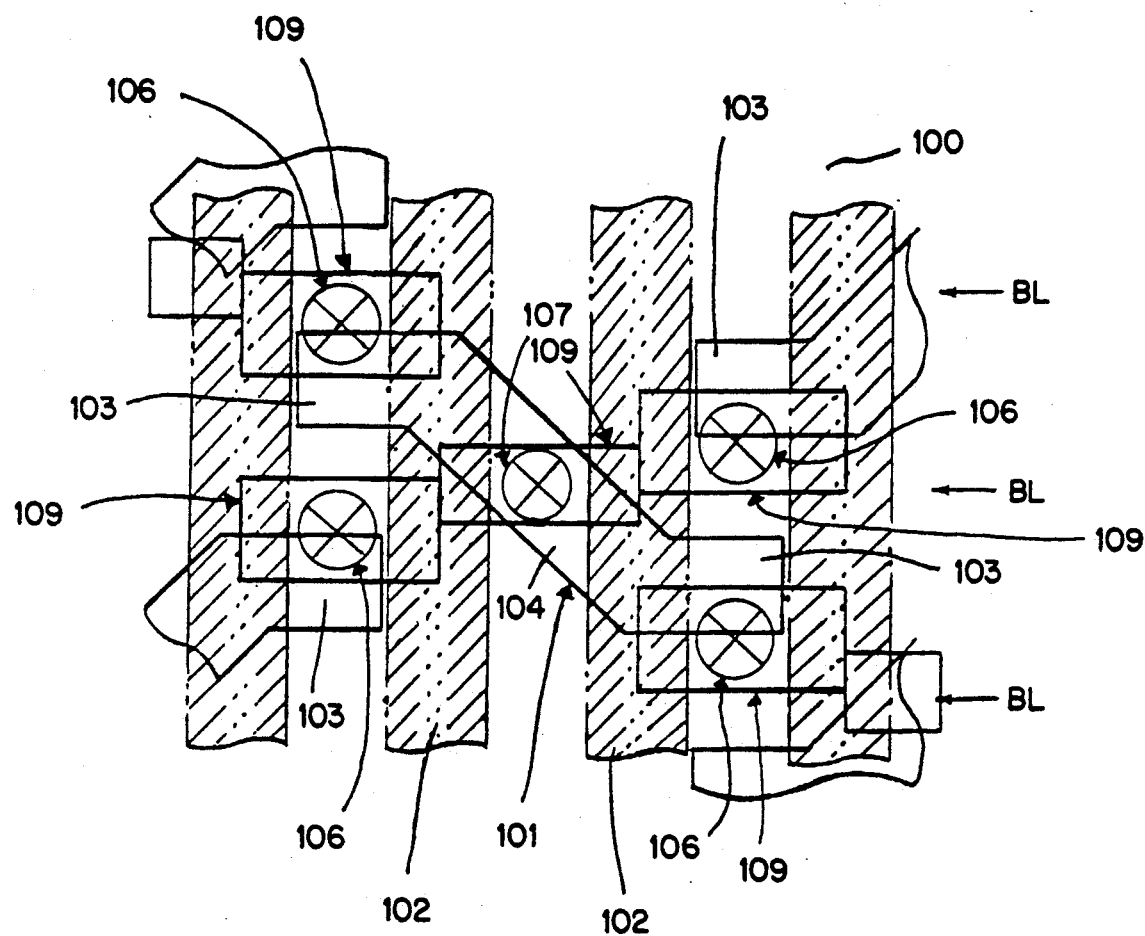
FIG. 8 is a plan view showing a further semiconductor memory device of this invention.

FIG. 8 shows a further semiconductor memory device according to this invention. This memory device includes a semiconductor substrate 100 with diagonal active regions 101 formed in the surface portion thereof. Gate electrodes 102 are formed on the semiconductor substrate 100. As can be seen from the figure, the diagonal active regions 101 are set diagonally across the gate electrodes 102. Each of the active regions 101 includes two source-side active regions 103 and a drain-side active region 104. Each source-side active region 103 and each drain-side active region 104 have contact areas 106 and 107, respectively. The portions of each active region 101 positioned under the gate electrodes 102 function as channel regions. Each diagonal active region 101 and the two gate electrodes 102 intersecting the active region 101 constitute two MOS transistors. Bit lines are to be disposed in the areas denoted by BL.

Impurity-implanted regions 109 overlap with part of each source-side active region 103, part of each contact area 106, part of each drain-side active region 104, and the entire area of each contact area 107. Impurity ions are implanted into the impurity-implanted regions 109 to form source and drain regions. The source regions are formed in the portions of the source-side active regions 103 overlapping with the impurity-implanted regions 109, and the drain regions are formed in the portions of the drain-side active regions 104 overlapping with the impurity-implanted regions 109.

Since the impurity-implanted regions 109 overlap with only part of each source-side active region 103, each of the resultant source regions occupies only part of the corresponding source-side active region 103. Also, the boundary between the source region and the channel region adjacent thereto occupies only a portion of the boundary between the source-side active region 103 and the channel region. Similarly, each of the drain regions occupies only part of the corresponding drain-side active region 104, and the boundary between the drain region and each channel region adjacent thereto also occupies only a portion of the entire boundary between the drain-side active region 104 and each channel region adjacent thereto.

As described above, in all the foregoing examples shown in FIGS. 1 through 8, the boundary between each channel region and the source region adjacent thereto occupies only a portion of the entire boundary between the channel region and the source-side active region adjacent thereto. Similarly, the boundary between each channel region and the drain region adjacent thereto occupies only a portion of the entire boundary between the channel region and the drain-side active region adjacent thereto. Thus, in a heat treatment process or the like to be performed after the ion implantation, the injected impurity ions are diffused by heat from the source and drain regions into the channel regions only through the above-mentioned portions of the boundaries between the channel regions and the source-side and drain-side active regions. Thus, the effective channel lengths do not become significantly shorter. Even in a memory device according to a fine design rule, the short channel effect can be significantly reduced. This assures high reliability in the storage operation of the semiconductor memory device.

Also in all the semiconductor memory devices of FIGS. 1 through 8, only part of each source-side active region and part of each drain-side active region overlap with the respective impurity-implanted regions, so that the total area of the resultant source and drain regions is reduced, as compared with the case where impurity-implanted regions overlap with the entire source-side and drain-side active regions. Thus, junction capacitance which arises between the semiconductor substrate and the source and drain regions can be reduced. The reduction in the junction capacitance decreases the parasitic capacitance of the semiconductor memory device.

According to the present invention, since the impurity-implanted regions overlay with only part of each source-side active region and part of each drain side-active region, it is possible to attain two excellent advantages, i.e., the reduction in the short channel effect and in the junction capacitance as described above. These two advantages are particularly noticeable in an LDD (Lightly Doped Drain) process where $N^+$ (high-concentration) ion implantation is not performed but $N^-$ (low-concentration) ion implantation alone is performed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device comprising a plurality of memory cells, each of which comprises:
   an MOS transistor including a source region, a drain region and a channel region;
   an active region including said source region, said drain region and said channel region of said MOS transistor, said active region being formed in the surface portion of a semiconductor substrate;
   an isolation region formed in the surface portion of said semiconductor substrate, said isolation region surrounding said active region, thereby forming a boundary between said isolation region and said active region;
   a gate electrode formed on the substrate for the MOS transistor in the active region so as to divide the active region into a source-side active region with a storage contact and a drain-side active region with a bit contact, the portion of said active region which is positioned under the gate electrode functioning as said channel region of the MOS transistor;
   a first impurity-implanted region formed in both of said isolation region and said source-side active region across a first portion of said boundary between said isolation region and said source-side active region so as to overlap with at least one part of said storage contact and the gate electrode, a portion of the source-side active region which partially overlaps with the first impurity-implanted region functioning as said source region of the MOS transistor; and
   a second impurity-implanted region formed in both of said isolation region and said drain-side active region across a second portion of said boundary between said isolation region and said drain-side active region so as to overlap with at least one part of said bit contact and the gate electrode, a portion of the drain-side active region which partially overlaps with the second impurity-implanted region functioning as said drain region of the MOS transistor.

2. A semiconductor memory device according to claim 1, wherein said active region is set diagonally across the gate electrode.

3. A semiconductor memory device comprising a plurality of memory cells, each of which comprises:
   an MOS transistor including a source region, a drain region and a channel region;
   an active region including said source region, said drain region and said channel region of said MOS transistor, said active region being formed in the surface portion of a semiconductor substrate;
   an isolation region formed in the surface portion of said semiconductor substrate, said isolation region surrounding said active region, thereby forming a boundary between said isolation region and said active region;
   a gate electrode formed on the substrate for the MOS transistor in the active region so as to divide the active region into a source-side active region with a storage contact and a drain-side active region with a bit contact, the portion of said active region which is positioned under the gate electrode functioning as said channel region of the MOS transistor;
   a first impurity-implanted region formed in both of said isolation region and said source-side active region across a first portion of said boundary between said isolation region and said source-side active region so as to overlap with at least one part of said storage contact and the gate electrode, the portion of the source-side active region which overlaps with the first impurity-implanted region functioning as said source region of the MOS transistor;
   a second impurity-implanted region formed in both of said isolation region and said drain-side active region across a second portion of said boundary between said isolation region and said drain-side active region so as to overlap with at least one part of said bit contact and the gate electrode, the portion of the drain-side active region which overlaps with the second impurity-implanted region functioning as said drain region of the MOS transistor,
   wherein the active regions are disposed in columns parallel to the gate electrode, and the active regions in two adjacent columns are alternately arranged so that all the distances between adjacent active regions are approximately equal to each other.

4. A semiconductor memory device comprising a plurality of memory cells, each of which comprises:
   an MOS transistor including a source region, a drain region and a channel region;
   an active region including said source region, said drain region and said channel region of said MOS transistor, said active region being formed in the surface portion of a semiconductor substrate;
   an isolation region formed in the surface portion of said semiconductor substrate, said isolation region surrounding said active region, thereby forming a boundary between said isolation region and said active region;
   a gate electrode formed on the substrate for the MOS transistor in the active region so as to divide the active region into a source-side active region with a storage contact and a drain-side active region with a bit contact, the portion of said active region which is positioned under the gate electrode functioning as said channel region of the MOS transistor;
   a first impurity-implanted region formed in both of said isolation region and said source-side active region across a first portion of said boundary between said isolation region and said source-side active region so as to overlap with at least one part of said storage contact and the gate electrode, the portion of the source-side active region which overlaps with the first impurity-implanted region functioning as said source region of the MOS transistor;
   a second impurity-implanted region formed in both of said isolation region and said drain-side active region across a second portion of said boundary between said isolation region and said drain-side active region so as to overlap with at least one part of said bit contact and the gate electrode, the portion of the drain-side active region which overlaps with the second impurity-implanted region functioning as said drain region of the MOS transistor, and wherein said active regions are T-shaped.

5. A semiconductor memory device comprising a plurality of memory cells, each of which comprises:

an MOS transistor including a source region, a drain region and a channel region;

an active region including said source region, said drain region and said channel region of said MOS transistor, said active region being formed in the surface portion of a semiconductor substrate;

an isolation region formed in the surface portion of said semiconductor substrate, said isolation region surrounding said active region, thereby forming a boundary between said isolation region and said active region;

a gate electrode formed on the substrate for the MOS transistor in the active region so as to divide the active region into a source-side active region with a storage contact and a drain-side active region with a bit contact, the portion of said active region which is positioned under the gate electrode functioning as said channel region of the MOS transistor;

a first impurity-implanted region formed in both of said isolation region and said source-side active region across a first portion of said boundary between said isolation region and said source-side active region so as to overlap with at least one part of said storage contact and the gate electrode, the portion of the source-side active region which overlaps with the first impurity-implanted region functioning as said source region of the MOS transistor;

a second impurity-implanted region formed in both of said isolation region and said drain-side active region across a second portion of said boundary between said isolation region and said drain-side active region so as to overlap with at least one part of said bit contact and the gate electrode, the portion of the drain-side active region which overlaps with the second impurity-implanted region functioning as said drain region of the MOS transistor, and wherein said active regions are Y-shaped.

6. A semiconductor memory device comprising a plurality of memory cells, each of which comprises:

an MOS transistor including a source region, a drain region and a channel region;

an active region including said source region, said drain region and said channel of said MOS transistor, said active region being formed in the surface portion of a semiconductor substrate;

an isolation region formed in the surface portion of said semiconductor substrate, said isolation region surrounding said active region, thereby forming a boundary between said isolation region and said active region;

a gate electrode formed on the substrate for the MOS transistor in the active region so as to divide the active region into a source-side active region with a storage contact and a drain-side active region with a bit contact, the portion of said active region which is positioned under the gate electrode functioning as said channel region of the MOS transistor;

a first impurity-implanted region formed in both of said isolation region and said source-side active region across a first portion of said boundary between said isolation region and said source-side active region so as to overlap with at least one part of said storage contact and the gate electrode, the portion of the source-side active region which overlaps with the first impurity-implanted region functioning as said source region of the MOS transistor;

a second impurity-implanted region formed in both of said isolation region and said drain-side active region across a second portion of said boundary between said isolation region and said drain-side active region so as to overlap with at least one part of said bit contact and the gate electrode, the portion of the drain-side active region which overlaps with the second impurity-implanted region functioning as said drain region of the MOS transistor, and wherein said active regions are V-shaped.

7. A semiconductor memory device comprising a plurality of memory cells, each of which comprises:

an MOS transistor including a source region, a drain region and a channel region;

an active region including said source region, said drain region and said channel region of said MOS transistor, said active region being formed in the surface portion of a semiconductor substrate;

an isolation region formed in the surface portion of said semiconductor substrate, said isolation region surrounding said active region, thereby forming a boundary between said isolation region and said active region;

a gate electrode formed on the substrate for the MOS transistor in the active region so as to divide the active region into a source-side active region with a storage contact and a drain-side active region with a bit contact, the portion of said active region which is positioned under the gate electrode functioning as said channel region of the MOS transistor;

a first impurity-implanted region formed in said source-side active region without crossing said boundary so as to overlap with at least one part of said storage contact and the gate electrode, a portion of the source-side active region which overlaps with the first impurity-implanted region functioning as said source region of the MOS transistor; and a second impurity-implanted region formed in said drain-side active region without crossing said boundary so as to overlap with at least one part of said bit contact and the gate electrode, a portion of the drain-side active region which overlaps with the second impurity-implanted region functioning as said drain region of the MOS transistor.

* * * * *